United States Patent [19]

Honda

[11] Patent Number: 5,488,258
[45] Date of Patent: Jan. 30, 1996

[54] CIRCUIT FOR MUTING NOISES IN A POWER AMPLIFIER

[75] Inventor: Jun Honda, Tokyo, Japan

[73] Assignee: Pioneer Electric Corporation, Tokyo, Japan

[21] Appl. No.: 205,257

[22] Filed: Mar. 3, 1994

[30] Foreign Application Priority Data

Mar. 5, 1993 [JP] Japan .................. 5-045569

[51] Int. Cl.⁶ ..................................... H03F 1/26
[52] U.S. Cl. .................. 307/64; 330/9; 330/149; 330/284; 307/112; 327/108; 327/306
[58] Field of Search ..................... 327/108, 306, 327/308, 348; 307/64, 112, 125, 126; 330/149, 9, 284

[56] References Cited

U.S. PATENT DOCUMENTS 4,296,278 10/1981 Cullison et al. ................. 179/1
5,128,567 7/1992 Tanaka et al. ..................... 307/572

Primary Examiner—William M. Shoop, Jr.
Assistant Examiner—Albert Paladini
Attorney, Agent, or Firm—Nikaido, Marmelstein, Murray & Oram

[57] ABSTRACT

A power detector is provided for detecting closing of a power switch in a power supply, for producing a power-on signal after a predetermined time from detection of the closing of the power switch. An abnormality detector is provided for detecting an abnormal voltage produced in a circuit of a power amplifier, for producing an abnormality signal when detected. In response to the power-on signal, an output stage of the power amplifier is activated, and the output stage is cut off in response to the abnormality signal.

7 Claims, 4 Drawing Sheets

# CIRCUIT FOR MUTING NOISES IN A POWER AMPLIFIER

BACKGROUND OF THE INVENTION

The present invention relates to an improvement for a circuit for muting a pulsy noise which is generated when a power supply of a power amplifier is turned on.

In an audio system, at the time when a power source of a power amplifier is turned on and off, a large pulsy noise such as a pop emitted from speakers. The noise is caused by an imbalance of operational timings of the power supply voltages of direct current (+Vcc, −Vcc), and when a capacitor of a feedback loop is charged. Such a transitional noise not only impairs the listening atmosphere but may further damage expensive loudspeakers.

In order to prevent the pulsy noise, there has been proposed a protecting circuit having a relay circuit together with a delay circuit between the power amplifier and the loudspeaker.

Referring to FIG. 4 showing a conventional protecting circuit, when a power switch 101 is closed, an alternating voltage is transmitted through a transformer 102 to a power supply circuit 103 comprising a rectifier and a smoothing circuit. The power supply circuit 103 applies a predetermined voltage to a power amplifier 105 to which an audio signal is fed through an input terminal 106. The audio signal is amplified and applied to a loudspeaker (not shown) through a relay circuit 108 and an output terminal 109. The relay circuit 108 has a relay and a delay timer.

The protecting circuit further has a power-on detecting circuit 104 comprising a rectifier and a comparator. The detecting circuit 104 applies a power-on signal to the delay timer of the relay circuit 108.

When the power switch 101 is turned on, the direct voltage is applied to the power amplifier 105, thereby operating it. At the same time, the alternating voltage is applied to the power-on detector 104 which accordingly applies the power-on signal to the delay timer of the relay circuit 108. After a few second from the time when the power-on signal is fed, the relay switch is closed, thereby applying the audio signal from the power amplifier 105 to the terminal 109.

Transistors and capacitors provided in the power amplifier 105 are actuated during these few seconds while the relay is kept opened. Hence the occurrence of pulsy noise is prevented.

However, the relay is expensive and moreover, unreliable. In addition, the use of the relay renders it difficult to reduce the size of the electronic devices such as the power amplifier. Furthermore, the relay decreases the quality of the sound emitted from the speaker.

SUMMARY OF THE INVENTION

An object of the present invention is to provide an improved circuit for muting noises caused by the power amplifier.

According to the present invention there is provided a circuit for muting an output of a power amplifier having a power supply, comprising a power switch provided in the power supply for turning on the power supply, power detector means for detecting closing of the power switch and for producing a power-on signal after a predetermined time from detection of the closing of the power switch, abnormality detector means for detecting an abnormal voltage produced in a circuit of the power amplifier and for producing an abnormality signal when detected, a power control circuit responsive to the power-on signal for activating at least an output stage of the power amplifier and for cutting off the output stage in response to the abnormality signal.

The output stage of the power amplifier includes transistors forming a push-pull amplifier.

The power detector means includes a delay timer for producing the power-on signal after the predetermined time from the detection of the closing of the power switch.

Other objects and features of this invention will become understood from the following description with reference to the accompanying drawings.

DETAILED DESCRIPTION OF THE PREFERRED EMBODIMENT

Figure 1:
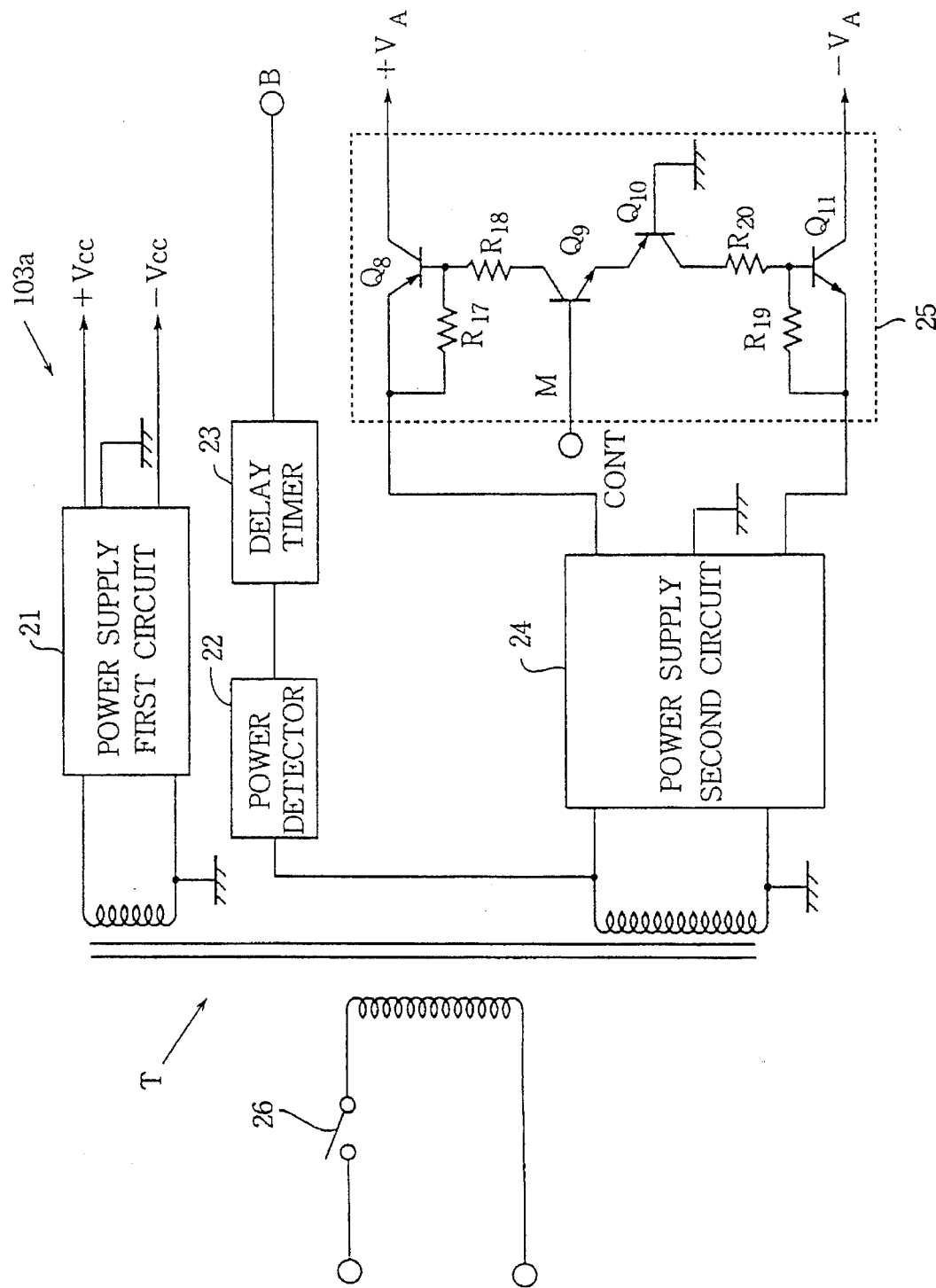
FIG. 1 is a circuit diagram of a power supply circuit provided in a muting circuit of the present invention.

Referring to FIG. 1, a power supply section 103a of a muting circuit of the present invention has a transformer T as a power supply. A power switch 26 is electrically connected to the transformer T. The power supply section 103a has a power supply first circuit 21 comprising a rectifier and a smoothing circuit for feeding a voltage $V_{CC}$ to power amplifier stage 105a shown in FIG. 2. The power supply section 103a further has a power supply second circuit 24 comprising a rectifier, smoothing circuit and a voltage stabilizer, and a bias voltage generating circuit 25 for applying a bias voltage $V_A$ to the power amplifier.

The bias voltage generating circuit 25 comprises transistors Q8, Q9, Q10 and Q11, resistors R17, R18, R19 and R20. The base of the transistor Q9 is connected to a terminal CONT, through which a muting control signal M which will later be described is fed. The collector of the transistor Q9 is connected to the base of the transistor Q8 through the resistor R18 and the emitter thereof to the emitter of the transistor Q10, the base of which is grounded. The collector of the transistor Q10 is connected to the base of the transistor Q11 through the resistor R20. The resistor R17 is provided between the emitter and the base of the transistor Q8, the collector thereof connected to the power amplifier stage 105a to apply the bias voltage $+V_A$. The resistor 19 is provided between the base and the emitter of the transistor Q11, the collector thereof also connected to the power amplifier stage 105a.

When a high level muting control signal M is applied to the base of the transistor Q9, the transistors Q9 and Q10 are rendered conductive. Hence the PNP transistor Q8 and the NPN transistor Q11 become conductive so that the current from the power supply circuit 24 is allowed to pass therethrough. The transistor Q10 is provided to set a voltage for the terminal CONT. The resistors R17 and R19 are provided to cut off the transistors Q8 and Q11, respectively.

A power detector 22 connected to the power supply second circuit 24 and delay timer 23 connected to the detector 22 are further provided in the power supply section 103a for controlling the muting of the power amplifier. The power detector 22 comprises a rectifier and a comparator, and the delay timer 23 comprises a rectifier, smoothing circuit, and a voltage stabilizer. When the power detector 22 detects that the power switch is turned on, a power-on signal is fed to the delay timer 23 which produces a signal B of a high level after a predetermined period of time.

Figure 2:
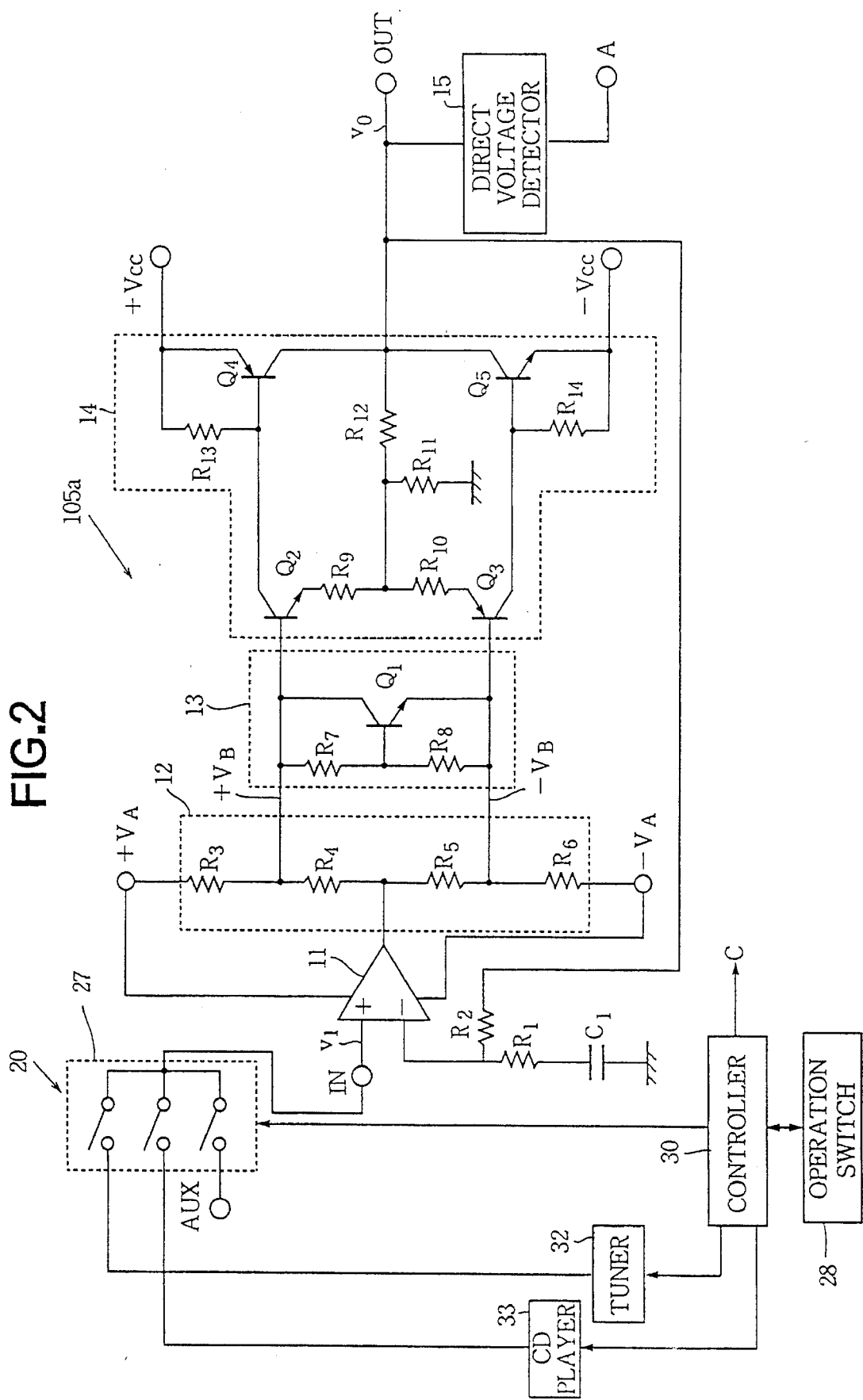
FIG. 2 is a circuit diagram of an amplifying section of the muting circuit.

Referring to FIG. 2, the power amplifier stage 105a has an opamp 11, voltage synthesizer 12, a temperature compensation and bias voltage setting circuit 13 and a collector output type push-pull amplifier stage 14. The non-inverting terminal of the opamp 11 is applied with an audio input signal v1. The inverting terminal of the opamp 11 is grounded through a resistor R1 and a capacitor C1, and further fed with a feedback signal through a resistor R2. The capacitor C1 is provided to shut off a direct current voltage component of the feedback signal fed back from the push-pull amplifier 14 to the opamp 11, and to provide a 100% negative feedback of the direct current voltage. The resistors R1 and R2 determine the gain of the alternating voltage in the entire circuit. The opamp 11 is further applied with the voltage $V_A$ from the bias voltage generating circuit 25 of the power supply section 103a, as a source voltage.

The output of the opamp 11 is fed to the voltage synthesizer 12 comprising resistors R3, R4, R5 and R6 connected in series. The output of the opamp 11 is fed between the resistors R4 and R5. The voltage synthesizer divides the voltage $V_A$ into bias voltage $V_B$ and synthesizes the output of the opamp 11 with the bias voltage.

The temperature compensation and bias voltage setting circuit 13 comprises resistors R7 and R8 and a transistor Q1, the base of which is connected between the resistors.

The push-pull amplifier stage 14 comprises a driver stage having transistors Q2 and Q3, and an output stage having transistors Q4 and Q5. The bases of the transistors Q2 and Q3 are connected to the collector and the emitter of the transistor Q1 of the bias setting circuit 13, respectively. The collector of the transistor Q2 is connected to the base of the transistor Q4, and the emitter thereof is connected to the emitter of the transistor Q3 through resistors R9 and R10 connected in series. The collector of the transistor Q3 is connected to the base of the transistor Q5. The collector of the transistor Q4 is connected to the collector of the transistor Q5. Each of resistors R13 and R14 is connected between the emitter and the base of each of the transistors Q4 and Q5 to provide a fixed bias. The output signal of the push-pull amplifier stage 14 is fed back to the inverting terminal of the opamp 11 through the resistor R2. The resistors R11 and R12 connected between the output and the ground form a voltage dividing circuit and provide a local negative feedback to the driver stage of the push-pull amplifier stage 14, thereby setting the distributing levels between the driver stage and the output stage.

The bias voltage $V_A$ is applied to the opamp 11 and the voltage synthesizer 12, thereby producing the bias voltages $+V_B$ and $-V_B$. The temperature compensation and bias voltage setting circuit 13 compensates the change of output voltage due to the change of temperature of the transistors Q2 to Q5 by the change of the voltage between the emitter and the base of the transistor Q1 due to the change thereof, thereby maintaining the voltage between the bases of the transistors Q2 and Q3 constant. Here, the collector-to-emitter voltage of the transistor Q1 is the value obtained by multiplying the base-to-emitter voltage and (R7+R8)/R8 together.

The collector supply voltage $V_{cc}$ is applied to the push-pull amplifier stage 14.

The output signal Vo of the power amplifier is fed to a direct current voltage detector 15. The direct current voltage detector 15 detects the direct current voltage component included in the output Vo and produces a high level signal A when the direct current voltage is higher than a reference level.

The opamp 11 is connected to an output of a selector 27 of an audio source 20. The audio source 20 has an operation switch 28 for operating the audio source 20 and a controller 30 for controlling the operation of the audio source in response to the operation of the operation switch 28. A tuner 32 and a CD player 33 are connected to the controller 30 and to the selector 24. The controller 30 is connected to the selector 27 for selectively closing a switch in the selector in order to connect a selected audio device to the opamp.

The controller 30 is adapted to produce a muting signal C for a predetermined time when one of the switches of the selector 27 is closed, a power switch of the tuner 32 or CD player 33 is turned on, the tuning operation of the tuner 32 is performed, and the selection of music of the CD player is operated.

Figure 3:
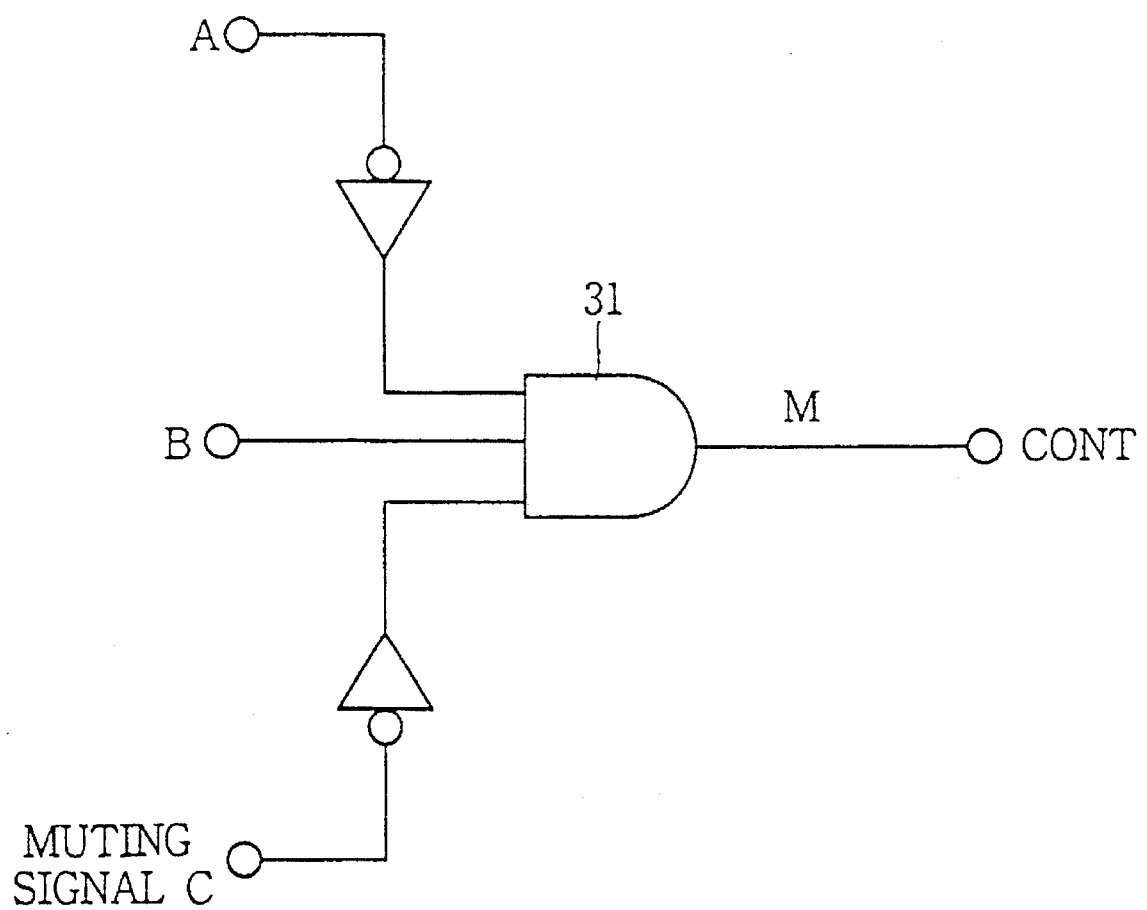
FIG. 3 is a circuit diagram of a power control circuit.
Figure 4:
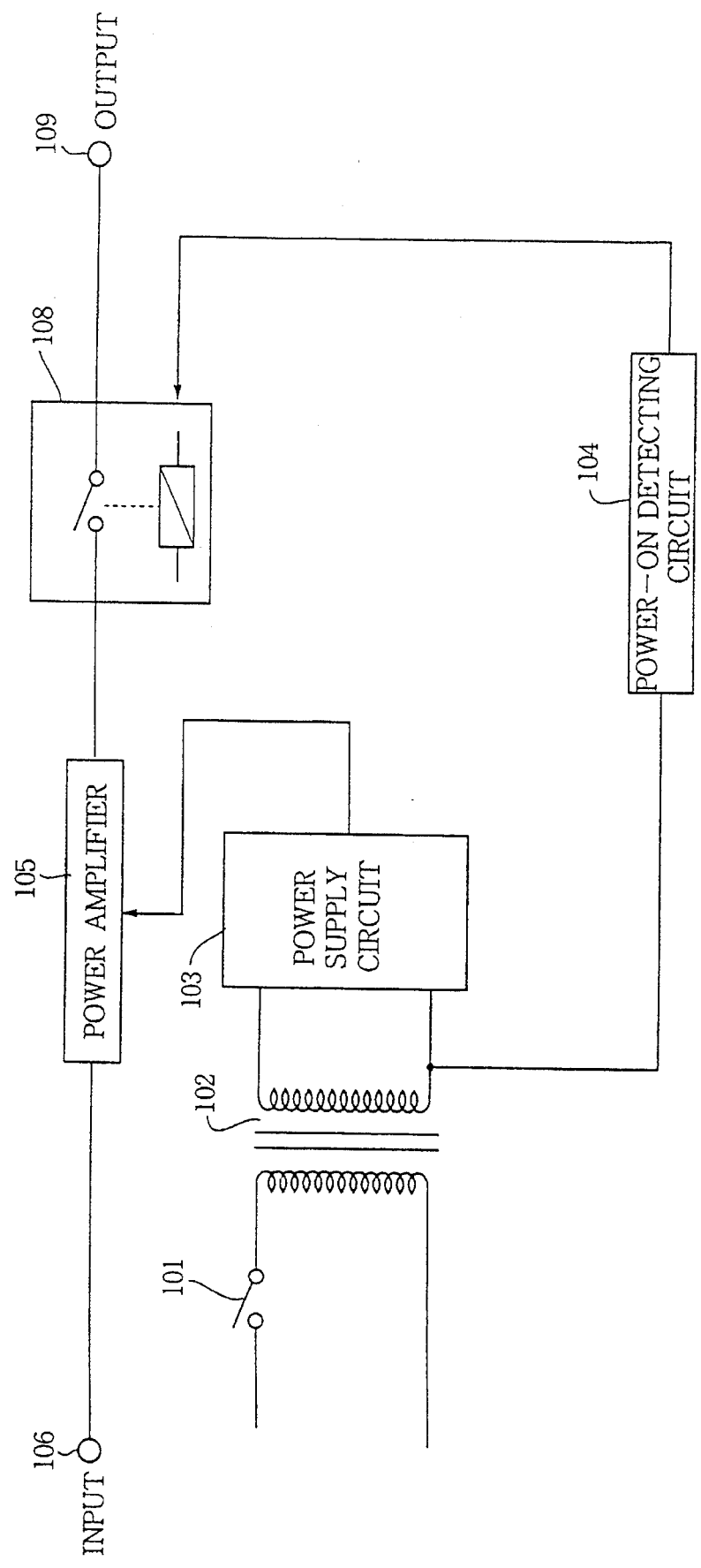
FIG. 4 is a circuit diagram of a conventional protecting circuit.

Referring to FIG. 3 showing a power control circuit, in order to generate a muting control signal M, there is provided an AND gate 31, the input terminals of which receive the signals A and B and the muting signal C. The signals A and C are respectively applied to the AND gate 31 through inverters. The AND gate 31 produces the muting control signal M when each of the levels of the signals A and C is at a low level and the signal B is at a high level.

The operation of the power amplifier is described hereinafter. When the power switch 26 of the power amplifier is closed, the power detector 22 detects that the power is turned on. The power-on signal is fed to the delay timer 23. The delay timer 23 accordingly produces a high-level signal B after the predetermined period.

Before the generation of signal B, since the level of the signal B is low, the AND gate 31 does not produce the muting control signal M. Hence the transistor Q9 of the bias voltage generating circuit 25 is rendered inoperative so that the supply of the bias voltage $V_A$ to the power amplifier 105a is cut off and the bias voltage $V_B$ becomes substantially zero. Thus, the power amplifier does not operate so that the speaker does not emit a pop.

After a predetermined period, the delay timer 23 generates a high level signal. If the direct current voltage is not included in the output signal Vo, the direct current voltage detector 15 feeds a low level signal A to the inverter of FIG. 3. The muting signal C is at a low level. Consequently, the level of the muting control signal M from the AND gate 31 becomes high which is applied to the base of the transistor Q9 of the bias voltage generation circuit 25. Hence the transistor Q9 is rendered conductive, thereby also rendering the transistors Q8, Q10 and Q11 conductive. Thus, the bias voltages $+V_A$ and $-V_A$ are applied to the voltage synthesizer 12, so that the power amplifier 105a is operated.

When the operation switch 28 is operated in order to select the tuner 32 or the CD player 33, the controller 30 produces the muting signal C. Accordingly, the AND gate 31 stops to produce the muting control signal M. As a result, the bias voltage $V_A$ disappears, and hence the power amplifier does not produce the output Vo. Thus, the speaker does not generate a pop caused by the switching operation of the selector 27.

After the predetermined time, the muting signal C disappears, so that the power amplifier becomes operative. The input signal V1 applied to the power amplifier is accordingly amplified and converted into the output signal Vo.

When the direct voltage detector 15 detects a direct current voltage in the output signal Vo, a high level signal A is fed to the inverter, so that the AND gate 31 generates a low level muting control signal M. Accordingly, the bias voltage generating circuit 25 is rendered inoperative, thereby cutting off the output signal Vo. Thus, the speaker does not emit a pop.

When the power switch 26 is turned off, the signal B disappears at once. Therefore, no pop is emitted from the speaker at the cutoff of the power.

In accordance with the present invention, there is provided a circuit for muting pulsy noise. Since the relays are eliminated, the sound quality is prevented from deteriorating. The muting is controlled at the bias voltage generating circuit, which consumes only a small power. Consequently, the transistors of the bias generating circuit may be turned on and off with semiconductors, thereby decreasing the cost, enhancing a quick response and increasing the reliability of system. When muting, the entire power amplifier is cutoff without generating a direct current voltage in the output signal. Thus the capacitors in the circuit is prevented from being charged. As a result, when the power amplifier is turned on again, the capacitors need not be discharged, thereby enabling to largely shorten the muting period set by the delay timer.

While the presently preferred embodiment of the present invention has been shown and described, it is to be understood that this disclosure is for the purpose of illustration and that various changes and modifications may be made without departing from the scope of the invention as set forth in the appended claims.

What is claimed is:

1. A circuit for muting an output of a power amplifier having a power supply, comprising:

a power switch provided in an input side of the power supply for turning on the power supply;

power detector means for detecting closing of the power switch and for producing a power-on signal after a predetermined time from detection of the closing of the power switch;

abnormality detector means for detecting an abnormal voltage produced in a circuit of the power amplifier and for producing an abnormality signal when detected;

a power control circuit responsive to the power-on signal for activating at least an output stage of the power amplifier after the predetermined time, and for cutting off the output stage in response to the abnormality signal.

2. The circuit according to claim 1 wherein
   the output stage of the power amplifier includes transistors forming a push-pull amplifier.

3. The circuit according to claim 1 wherein
   the power detector means includes a delay timer for producing the power-on signal after the predetermined time from the detection of the closing of the power switch.

4. The circuit according to claim 2 wherein
   the power control circuit is provided to produce a muting control signal having either of a higher level and a lower level in response to the power signal and the abnormality signal, and further comprising a bias voltage generating circuit responsive to the muting control signal having one of the levels for applying a bias voltage to a circuit of the power amplifier, thereby activating the transistors of the output stage, and for cutting off the transistors in response to the muting control signal having the other level.

5. The circuit according to claim 4 wherein
   the power control circuit includes a logic circuit for producing the muting control signal for activating the transistors when the power-on signal is applied and the abnormality signal is not applied thereto.

6. The circuit according to claim 5 further comprising muting signal producing means responsive to operation for changing an input signal to the power amplifier to produce a muting signal for a predetermined time, the logic circuit produces the muting control signal for activating the transistors in an additional condition that the muting signal is not applied thereto.

7. A circuit for muting an output of a power amplifier of an audio device having a power supply, comprising:

a power switch provided in the power supply for turning on the power supply;

power detector means for detecting closing of the power switch and for producing a power-on signal after a predetermined time from detection of the closing of the power switch;

abnormality detector means for detecting an abnormal voltage produced in a circuit of the power amplifier and for producing an abnormality signal when detected;

a power control circuit responsive to the power-on signal for activating at least an output stage of the power amplifier and for cutting off the output stage in response to the abnormality signal.

* * * * *